(12) United States Patent
Lue et al.

(10) Patent No.: US 7,576,386 B2
(45) Date of Patent: Aug. 18, 2009

(54) NON-VOLATILE MEMORY SEMICONDUCTOR DEVICE HAVING AN OXIDE-NITRIDE-OXIDE (ONO) TOP DIELECTRIC LAYER

(75) Inventors: Hang-Ting Lue, Hsinchu (TW); Erh-Kun Lai, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/197,668

(22) Filed: Aug. 4, 2005

(65) Prior Publication Data

US 2007/0029625 A1 Feb. 8, 2007

(51) Int. Cl.
*H01L 29/94* (2006.01)
(52) U.S. Cl. .................. 257/324; 257/E21.21
(58) Field of Classification Search .......... 257/324, 257/E21.21
See application file for complete search history.

(56) References Cited

U.S. PATENT DOCUMENTS 4,173,766 A 11/1979 Hayes (Continued)

FOREIGN PATENT DOCUMENTS

EP 1411555 11/2006

(Continued)

OTHER PUBLICATIONS

Chindalore, G.L., et al., A New Combination-Erase Technique for Erasing Nitride Based (SONOS) Nonvolatile Memories, IEEE Electron Device Letters, vol. 24, No. 4, Apr. 2003 Silicon Devices, pp. 257-259.

(Continued)

*Primary Examiner*—Bradley K Smith
*Assistant Examiner*—Amar Movva
(74) *Attorney, Agent, or Firm*—Haynes Beffel & Wolfeld LLP (57) ABSTRACT

A non-volatile memory (NVM) cell includes a silicon substrate having a main surface, a source region in a portion of the silicon substrate, a drain region in a portion of the silicon substrate, and a well region disposed in a portion of the silicon substrate between the source and drain regions The cell includes a bottom oxide layer formed on the main surface of the substrate. The bottom oxide layer is disposed on a portion of the main surface proximate the well region. The cell includes a charge storage layer disposed above the bottom oxide layer, a dielectric tunneling layer disposed above the charge storage layer and a control gate formed above the dielectric tunneling layer. The dielectric tunneling layer includes a first oxide layer, a nitride layer and a second oxide layer. Erasing the NVM cell includes applying a positive gate voltage to inject holes from the gate.

16 Claims, 6 Drawing Sheets

U.S. PATENT DOCUMENTS

| | | | |
|---|---|---|---|
| 4,630,086 | A | 12/1986 | Sato et al. |
| 5,286,994 | A | 2/1994 | Ozawa et al. |
| 5,319,229 | A * | 6/1994 | Shimoji et al. ............... 257/324 |
| 5,952,692 | A | 9/1999 | Nakazato et al. |
| 6,011,725 | A | 1/2000 | Eitan |
| 6,026,026 | A | 2/2000 | Chan et al. |
| 6,074,917 | A | 6/2000 | Chang et al. |
| 6,169,693 | B1 | 1/2001 | Chan et al. |
| 6,218,700 | B1 | 4/2001 | Papadas |
| 6,512,696 | B1 | 1/2003 | Fan et al. |
| 6,624,028 | B1 | 9/2003 | Wen |
| 6,680,509 | B1 | 1/2004 | Wu et al. |
| 6,709,928 | B1 | 3/2004 | Jenne et al. |
| 6,720,630 | B2 | 4/2004 | Mandelman et al. |
| 6,784,480 | B2 | 8/2004 | Bhattacharyya |
| 6,818,558 | B1 | 11/2004 | Rathor et al. |
| 6,897,533 | B1 | 5/2005 | Yang et al. |
| 6,912,163 | B2 | 6/2005 | Zheng et al. |
| 6,977,201 | B2 * | 12/2005 | Jung ............................ 438/263 |
| 7,115,942 | B2 | 10/2006 | Wang |
| 2003/0030100 | A1 | 2/2003 | Lee et al. |
| 2003/0047755 | A1 * | 3/2003 | Lee et al. ..................... 257/200 |
| 2003/0089935 | A1 | 5/2003 | Fan et al. |
| 2003/0146465 | A1 * | 8/2003 | Wu ............................. 257/314 |
| 2003/0224564 | A1 | 12/2003 | Kang et al. |
| 2004/0079983 | A1 | 4/2004 | Chae et al. |
| 2004/0152260 | A1 | 8/2004 | Rabkin et al. |
| 2004/0183126 | A1 * | 9/2004 | Bae et al. ..................... 257/324 |
| 2005/0006696 | A1 | 1/2005 | Noguchi et al. |
| 2005/0074937 | A1 * | 4/2005 | Jung ............................ 438/257 |
| 2005/0101089 | A1 | 5/2005 | Kim et al. |
| 2006/0258090 | A1 | 11/2006 | Bhattacharyya et al. |
| 2006/0261401 | A1 | 11/2006 | Bhattacharyya |
| 2007/0012988 | A1 | 1/2007 | Bhattacharyya |

FOREIGN PATENT DOCUMENTS

| | | |
|---|---|---|
| JP | 2004 363329 | 12/2004 |

OTHER PUBLICATIONS

Eitan, B., et al., NROM: A Novel Localized Trapping, 2-Bit Nonvolatile Memory Cell, IEEE Electron Device Letters, vol. 21, No. 11, Nov. 2000, pp. 543-545.

Ito, F., et al., A Novel MNOS Technology Using Gate Hole Injection in Erase Operation for Embedded Nonvolatile Memory Applications, 2004 Symposium on VLSI Technology Digest of Technical Papers, pp. 80-81.

Minami, S., et al., New Scaling Guidelines for MNOS Nonvolatile Memory Devices, IEEE Transactions on Electron Devices, vol. 38, No. 11, Nov. 1991, pp. 2519-2526.

Sung, S.K., et al., Multi-Layer SONOS with Direct Tunnel Oxide for High Speed and Long Retention Time, IEEE 2002 Silicon Nanoelectronics Workshop, (Honolulu HI, USA) Jun. 9-10, 2002 p. 83-84.

Walker, A.J., 3D TFT-SONOS Memory Cell for Ultra-High Density File Storage Applications, 2003 Symposium on VLSI Technology Digest of Technical Papers, 2 pages (unnumbered).

White, M.H., et al. On the Go with SONOS, IEEE, Circuits & Devices, Jul. 2000, pp. 22-31.

Cho et al., "Simultaneous Hot-Hole Injection at Drain and Source for Efficient Erase and Excellent Endurance in SONOS Flash EEPROM Cells," IEEE Electron Dev. Lett. 24(4) Apr. 2003 260-267.

Shih et al., "A Novel 2-bit/cell Nitride Storage Flash Memory with Greater than 1M P/E-cycle Endurance," IEEE IEDM 04-881-884, 2004, 36.31-36.3.4.

Blomme et al., "Multilayer tunneling barriers for nonvolatile memory applicatins," Device Research Conference 2002, 60th DRC Conf. Digest 153-154.

Blomme et al., "Write/Erase Cycling Endurance of Memory Cells with Si02/Hfo2 Tunnel Dielectric," IEEE Trans. on Device and Materials Reliability 4(3), Sep. 2004, 345-351.

Govoreanu et al., "VARIOT. A Novel Multilayer Tunnel Barrier Concept for Low-Voltage Nonvolatile Memory Devices," IEEE Electron Device Letters 24(2), Feb. 2003, 99-101.

Govoreanu et al. "Simulation of Nanofloating Gate Memory with High-k Stacked Dielectrics," IEEE SISPAD Intl. Conf. Sep. 3-5, 2003, 299-302.

Govoreanu et al., "An Investigation of the Electron Tunneling Leakage Current Through Ultrathin Oxides/High-k Gate Stacks at Inversion Conditions," IEEE SISPAD Intl. Conf., Sep. 3-5 2003, 287-290.

Kim et al., "Robust Multi-bit Programmable Flash Memory Using a Resonant Tunnel Barrier," Electron Devices Mtg., Dec. 5-7, 2005, IEDM Tech Digest, 861-864.

Likharev, "Layered tunnel barriers for nonvolatile memory devices," Appl. Phys. Lett. 73(15) Oct. 1998, 2137-2139.

Lue et al., "BE-SONOS: A Bandgap Engineered SONOS with Excellent Performance and Reliability," IEDM Tech. Digest, Dec. 2005, 547-550.

Aminzadeh, et al, "Conduction and Charge Trapping in Polysilicon-Silicon Nitride-Oxide-Silicon Structures under Positive Gate Bias," IEEE Transactions on Electron Devices 35(4) Apr. 1998, 459-467.

Yamada, et al., "A Self-Convergence Erasing Scheme for a Simple Stacked Gate Flash EEPROM," Proc. of IEDM IEEE Dec. 1991 307-310.

Takata, M., et al., "New Non-Volatile Memory with Extremely High Density Metal Nano-Dots," IEEE IEDM 03-553, 22.5.1-22.5.4.

Lee, Chungho, et al., "Operational and Reliability Comparison of Discrete-Storage Nonvolatile Memories: Advantages of Single-and Double-Layer Metal Nanocrystals," IEEE IEDM.03-557, 22.6.1-22.6.4.

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Lee, Chang, et al., "A Novel SONOS Structure of SiO2/SiN/Al2O3 with TaN Metal Gate for Multi-Giga Bit Flash Memeries," IEEE 2003 4 pages.

Notice of Allowance mailed Aug. 28, 2008, U.S. Appl. No. 11/554,455, 12 pages.

Office Action mailed May 30, 2008 in U.S. Appl. No. 11/300,813, 22 pages.

Office Action Mailed Sep. 17, 2008 in U.S. Appl. No. 11/324,492, 9 pages.

Response to Sep. 17, 2008 Office Action filed on Dec 15, 2008 in U.S. Appl. No. 11/324,492, 7 pages.

Supplemental Amendment filed on Dec. 29, 2008 in U.S. Appl. No. 11/324,492, 36 pages.

Office Action Mailed Sep. 17, 2008 in U.S. Appl. No. 11/324,492, 9 pages.

* cited by examiner

NON-VOLATILE MEMORY SEMICONDUCTOR DEVICE HAVING AN OXIDE-NITRIDE-OXIDE (ONO) TOP DIELECTRIC LAYER

BACKGROUND OF THE INVENTION

The present invention relates to a non-volatile memory semiconductor device and a method for manufacturing a non-volatile memory semiconductor device, and more particularly, to a non-volatile memory semiconductor device having an oxide-nitride-oxide (ONO) top dielectric layer and a method for manufacturing a non-volatile memory semiconductor device having an ONO top dielectric layer.

Non-volatile memory ("NVM") refers to semiconductor memory which is able to continually store information even when the supply of electricity is removed from the device containing such an NVM memory cell. NVM includes Mask Read-Only Memory (Mask ROM), Programmable Read-Only Memory (PROM), Erasable Programmable Read-Only Memory (EPROM) and Electrically Erasable Programmable Read-Only Memory (EEPROM). Typically, NVM can be programmed with data, read and/or erased, and the programmed data can be stored for a long period of time prior to being erased, even as long as ten years.

Nitride read only memory (NROM) is a type of EEPROM that uses charge-trapping for data storage. An NROM cell is typically composed of a metal-oxide-silicon field effect transistor (MOSFET) having an ONO (oxide-nitride-oxide) layer disposed between the gate and the source/drain of the semiconductor material. The nitride layer in the ONO layer is able to "trap" charge (electrons) when the device is "programmed." Charge localization is the ability of the nitride material to store the charge without significant lateral movement of the charge throughout the nitride layer. NROM utilizes a relatively thick tunnel oxide layer, which typically negatively impacts the time it takes to erase a memory cell. NROM can be contrasted with conventional "floating gate" memory cells wherein the floating gate is conductive and the charge is spread laterally throughout the entire floating gate and charge is transferred through a tunnel oxide layer. Programming (i.e., charge injection) of the charge-trapping layer in NROM cells can be carried out by various hot carrier injection methods such as channel hot electron injection (CHE), source side injection (SSI) or channel initiated secondary electron (CHISEL) which all inject electrons into the nitride layer. Erasing is performed by applying a positive gate voltage, which permits hole tunneling through the ONO top dielectric layer from the gate. Erasing (i.e., charge removal) in NROM devices is typically carried out by band-to-band hot hole tunneling (BTBHHT). However, BTBHHT erasing causes many reliability issues with NROM devices and causes degradation of the NROM devices and charge loss after many program/erase cycles. Reading is carried out in a forward or reverse direction. Localized charge-trapping technology allows two separate bits per cell, thus resulting in a doubling of memory density. The NROM can be repeatedly programmed, read, erased and/or reprogrammed by known voltage application techniques.

Figure 4A:
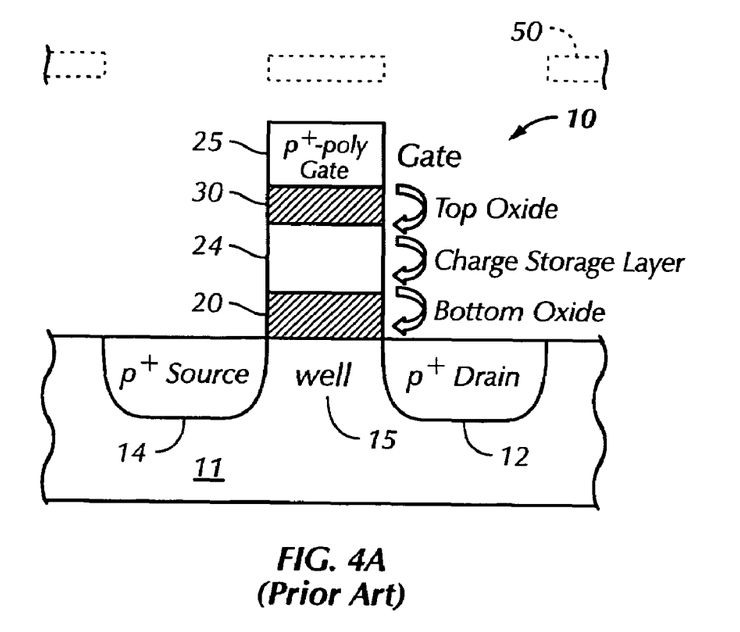
FIG. 4A is a partial sectional side elevational view of a conventional non-volatile memory (NVM) silicon-oxide-nitride-oxide-silicon (SONOS) memory cell.
Figure 4B:
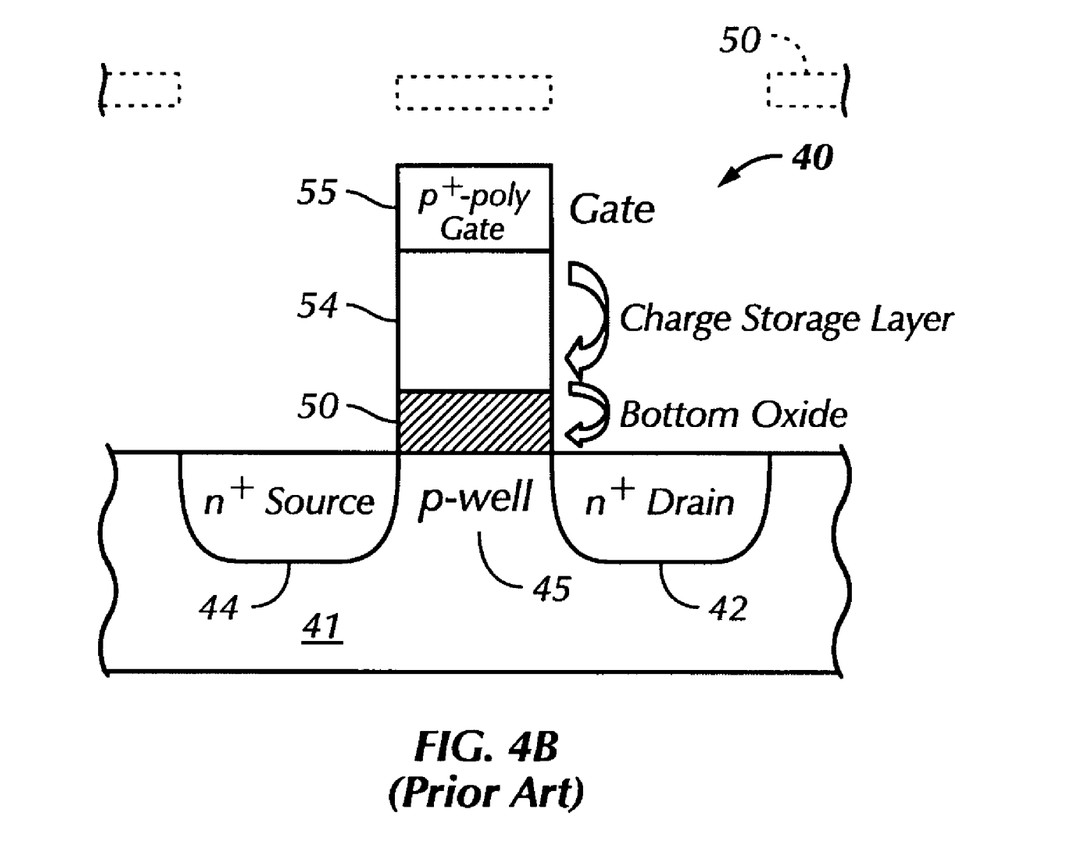
FIG. 4B is a partial sectional side elevational view of a conventional non-volatile memory (NVM) metal-nitride-oxide-silicon (MNOS) memory cell.

Another EEPROM is a metal-nitride-oxide-silicon (MNOS) memory cell as shown in FIG. 4B. A typical MNOS 40 includes a very thin layer of insulating material 50 like silicon dioxide (SiO2) to separate a silicon nitride charge storage region 54 from a gate 55 and from a well region 45 of the semiconductor device. An MNOS 40 also includes a substrate 41 in which a source 44 and a drain 42 are formed. The well region 45 is disposed between the source 44 and the drain 42 under the gate 55. Erasing an MNOS 40 includes injecting holes into the nitride region 54 from the gate 55. This is accomplished by using a large positive gate voltage while grounding the source 44, the drain 42 and the substrate 41. In order to facilitate hole injection from the gate 55, there is nothing between the nitride 54 and the gate 55. However, such MNOS devices 40 suffer from charge retention problems in the nitride region 54 because electrons can easily "de-trap" from the nitride region 54 into the gate 55.

Yet another EEPROM is a silicon-oxide-nitride-oxide-silicon (SONOS) memory cell.

U.S. Pat. No. 6,011,725 (Eitan), the entire contents of which is incorporated by reference herein, provides a detailed comparison of several of the prior art NVMs including respective programming, erasing and reading techniques. The Eitan patent also discloses a type of SONOS memory cell capable of storing two data bits by localized charge storage techniques.

A typical conventional SONOS device 10 is shown in FIG. 4A. The conventional SONOS device 10 includes a silicon substrate 11, a source 14, a drain 12, a well region 15 and a first oxide layer 20 on top of the well region 15 extending over portions of the source 14 and the drain 12. A nitride charge storage layer 24 is provided above the first oxide layer 20 and a second oxide layer 30 is provided above the nitride charge storage layer 24. A polysilicon (poly) gate 25 is disposed on top of the ONO stack 20, 24, 30. By providing the second oxide layer 30 on top of the nitride layer 24 there is an improvement in the ability to control where the charge is placed or stored within the nitride layer 24 during programming operations. Additionally, the addition of the second oxide layer 24 prevents holes from entering from the overlying gate 25. In order for electrons to be able to tunnel through the oxide layer 20, the oxide layer 20 must be relatively thin, e.g., 20-30 Angstroms (Å). However, direct tunneling at retention still occurs which causes unsatisfactory retention results.

It is desirable to provide a non-volatile memory semiconductor device that has improved charge retention compared to conventional SONOS and MNOS devices. It is desirable to provide a non-volatile memory semiconductor device having a band-gap engineered oxide-nitride-oxide (ONO) top dielectric layer which serves as a blocking oxide or top oxide layer. It is also desirable to provide a non-volatile memory which can be erased using gate-injected holes by applying a positive gate voltage.

BRIEF SUMMARY OF THE INVENTION

Briefly stated, the present invention comprises a non-volatile memory cell including a silicon substrate having a main surface, a source region in a portion of the silicon substrate proximate the main surface, and a drain region in a portion of the silicon substrate proximate the main surface. The drain region is spaced apart from the source region. A well region is disposed in a portion of the silicon substrate proximate the main surface between the source region and the drain region. The cell includes a bottom oxide layer formed on the main surface of the substrate. The bottom oxide layer is disposed on a portion of the main surface proximate the well region. A charge storage layer is disposed above the bottom oxide layer relative to the main surface of the silicon substrate. A dielectric tunneling layer is disposed above the charge storage layer relative to the main surface of the silicon substrate. The dielectric tunneling layer includes, in order relative to the main surface of the silicon substrate and outward, a first dielectric oxide layer, a dielectric nitride layer and a second dielectric oxide layer. A control gate is disposed above the dielectric tunneling layer relative to the main surface of the silicon substrate.

The present invention also comprises a method of forming a memory cell including providing a silicon substrate having a main surface, forming a source region in a portion of the silicon substrate proximate the main surface and forming a drain region in a portion of the silicon substrate proximate the main surface. The drain region is spaced apart from the source region. A well region is defined in a portion of the silicon substrate proximate the main surface between the source region and the drain region. A bottom oxide layer is deposited on the main surface of the substrate. The bottom oxide layer is disposed on a portion of the main surface proximate the well region. A charge storage layer is formed above the bottom oxide layer relative to the main surface of the silicon substrate. A first dielectric oxide layer is deposited above the charge storage layer relative to the main surface of the silicon substrate. A dielectric nitride layer is deposited above the first dielectric oxide layer relative to the main surface of the silicon substrate. A second dielectric oxide layer is deposited above the dielectric nitride layer relative to the main surface of the silicon substrate. A control gate is formed above the dielectric tunneling layer relative to the main surface of the silicon substrate.

In yet another aspect, the present invention comprises a method of erasing a non-volatile memory cell. The non-volatile memory cell includes a silicon substrate, a control gate, a source, a drain, a well region between the source and the drain, a bottom oxide layer above the well region, a charge storage layer above the bottom oxide layer and an oxide layer-nitride layer-oxide layer (ONO) dielectric layer between the charge storage layer and the control gate. The method includes applying a positive gate erasing voltage to the control gate sufficient to cause hole tunneling from the control gate toward the charge storage layer and applying a source/drain programming voltage to one of the source region and the drain region and coupling the other of the source region and the drain region to reference. The source/drain programming voltage is sufficient to cause electron tunneling from the well region toward the charge storage nitride region.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a," as used in the claims and in the corresponding portions of the specification, means "at least one."

One (1) micron or micrometer (μm) is 10,000 Angstroms (Å) or 1000 nanometers (mn).

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Figure 1A:
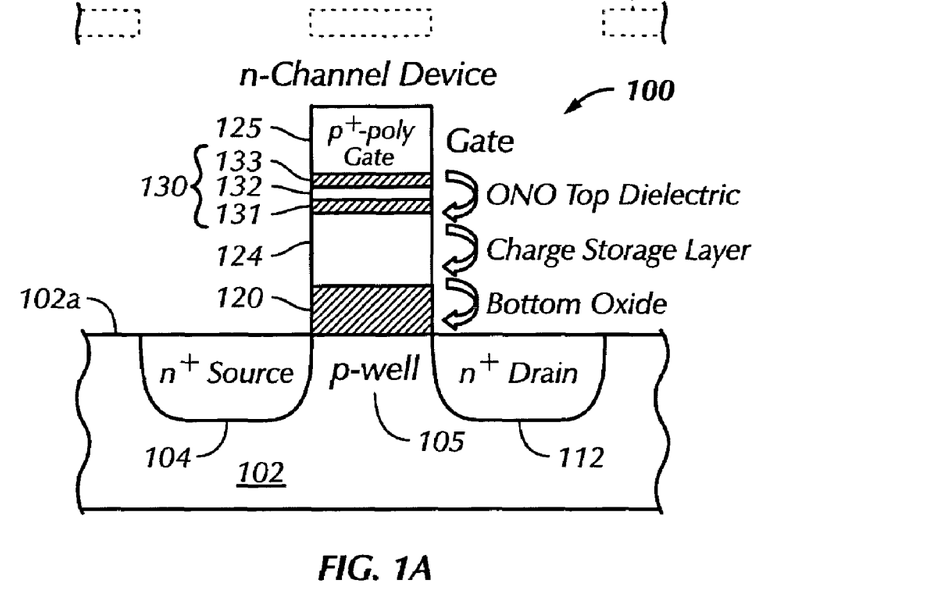
FIG. 1A is a partial sectional side elevational view of an n-channel non-volatile memory (NVM) cell having an oxide-nitride-oxide (ONO) dielectric layer in accordance with a first preferred embodiment of the present invention.
Figure 2:
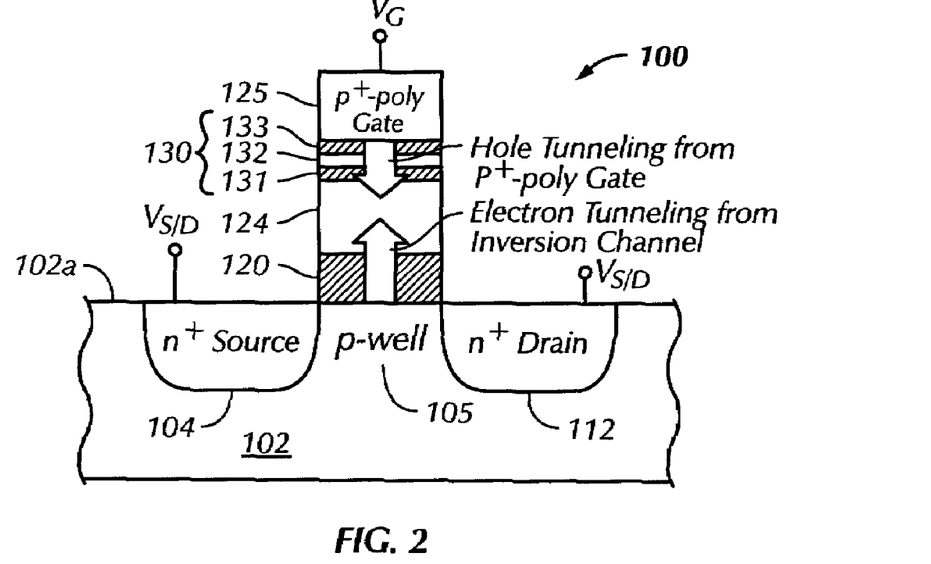
FIG. 2 is a partial sectional side elevational view of the NVM cell of FIG. 1A showing hole tunneling and electron tunneling directional pathways.

Referring to the drawings in detail, wherein like numerals reference indicate like elements throughout, there is shown in FIGS. 1A and 2 a non-volatile memory (NVM) cell 100 in accordance with a first preferred embodiment of the present invention. The NVM cell 100 includes a silicon substrate 102 having a main surface 102a, a source region 104 in a portion of the silicon substrate 102 proximate the main surface 102a, and a drain region 112 in a portion of the silicon substrate 102 proximate the main surface 102a. The drain region 112 is spaced apart from the source region 104. A well region 105 is disposed in a portion of the silicon substrate 102 proximate the main surface 102a between the source region 104 and the drain region 112. The NVM cell 100 includes a bottom oxide layer 120 formed on the main surface 102a of the silicon substrate 102. The bottom oxide layer 120 is disposed on a portion of the main surface 102a proximate the well region 105. A charge storage layer 124 is disposed above the bottom oxide layer 120 relative to the main surface 102a of the silicon substrate 102. A dielectric tunneling layer 130 is disposed above the charge storage layer 124 relative to the main surface 102a of the silicon substrate 102. The dielectric tunneling layer 130 includes, in order relative to the main surface 102a of the silicon substrate 102 and outward, a first dielectric oxide layer 131, a dielectric nitride layer 132 and a second dielectric oxide layer 133, thus the dielectric tunneling layer 130 is an oxide-nitride-oxide (ONO) layer 130. A control gate 125 is disposed above the dielectric tunneling layer 130 relative to the main surface 102a of the silicon substrate 102.

As shown, the NVM cell 100 is an N-channel device (FIG. 1A) because the source region 104 and drain region 112 are both n-type regions and the well region 105 is a p-type region. Thus, a p-type substrate 102 can be doped or implanted with an n-type material in the areas where the desired source and drain regions 104, 112 are to be located. Alternately, trenches (not shown clearly) may be formed in the p-type substrate 102 for desired source and drain regions 104, 112, and the trenches can be refilled with an n-type material such as with a heavily doped n-type polysilicon (n$^+$) and the like.

The bottom oxide layer 120 is preferably between about 30-90 Angstroms (Å) in thickness. The bottom oxide layer 120 is formed of an oxide such as silicon dioxide ($SiO_2$), Aluminum Oxide ($Al_2O_3$) and the like. The bottom oxide layer 120 is preferably thicker than 30 Å in order to prevent direct-tunneling charge loss from the charge storage layer 124 after the NVM cell 100 has been programmed (i.e., charge has been intentionally stored on the charge storage layer 124). Thus, the bottom oxide layer 120 functions as an insulating layer.

The charge storage layer 124 is preferably between about 50-150 Å in thickness. The charge storage layer 124 is preferably formed of a nitride such as Silicon Nitride ($Si_3N_4$), Silicon Oxynitride ($SiO_xN_x$) and the like. The charge storage layer 124 may be alternate materials instead of nitride such as a trapping insulating material such as Aluminum Oxide ($Al_2O_3$), Hafnium Oxide ($HfO_2$) and the like. The charge storage layer 124 provides the programmable memory storage portion of the NVM cell 100. The charge storage layer 124 is preferably a material that efficiently traps or stores charge after a programming operation which entails applying a programming voltage potential to the control gate 125 and one of the source region 104 and the drain region 112 in order to induce charge into the charge storage layer 124.

The ONO top dielectric 130 is a bandgap-engineered tunneling dielectric layer that provides an efficient tunneling barrier for hole injection from the gate 125, yet prevents direct tunneling leakage during desired charge retention. The ONO top dielectric layer 130 is a multi-layer structure (sandwiched) where each of the first and second dielectric oxide layers 131 and 133 and the dielectric nitride layer 132 is preferably between about 10-30 Å in thickness. For example, the first dielectric oxide layer 131 can be about 18 Å in thickness, the dielectric nitride layer 132 can be about 20 Å in thickness and the second dielectric oxide layer 133 can be about 15 Å in thickness. The dielectric nitride layer 132 is preferably formed of silicon nitride or other insulating dielectric materials with a low hole-barrier height of less than about 3 electron-volts (eV). Silicon nitride as a relatively low hole barrier on the order of 1.9 eV, so it may become "transparent" to hole tunneling under a relatively high electric-field such as when voltage applied to the control gate 125 is greater than zero.

The dielectric tunneling layer 130 functions as a tunneling dielectric for hole tunneling from the control gate 125 during an erase operation. Due to the reduced thickness of the first and second dielectric oxide layers 131, 133 and the dielectric nitride layer 132, the dielectric tunneling layer 130 has negligible charge trapping efficiency itself. Thus, the relatively thin dielectric nitride layer 132 of the ONO top dielectric layer 130 does not trap charge during memory programming and retention operations.

Thus, the NVM cell 100 is preferably a silicon-oxide-nitride-oxide-nitride-oxide-silicon (SONONOS) device wherein the gate 125 is formed of polysilicon, the top dielectric layer 130 is formed of oxide-nitride-oxide (ONO), the charge storage layer 124 is formed of nitride and the blocking layer 120 is formed of oxide which are all on top of the silicon substrate 102.

The control gate 125 may be formed of undoped polysilicon, doped polysilicon or a metal. For example, the control gate 125 may be lightly or heavily n-doped polysilicon, lightly or heavily p-doped polysilicon, platinum (Pt), Tantalum Nitride (TaN) and the like.

The operation of the NVM cell 100 is as follows. An erasing operation entails applying a gate erasing voltage $V_G$ (FIG. 2) to the control gate 125 and a source/drain erasing voltage $V_{S/D}$ (FIG. 2) to one of the source region 104 and the drain region 112 in order to induce charge into the charge storage layer 124. The NVM cell 100 is erased by applying a positive direct current voltage (+VDC) to the control gate 125 in order to provide hole tunneling from the control gate 125 toward the charge storage layer 124. The positive gate erasing voltage $V_G$ is preferably between about +10 to about +18 VDC. Additionally, a negative source/drain erasing voltage (-VDC) is applied to one of the source region 104 and the drain region 112 to reference (i.e., zero potential or ground). The negative source/drain erasing voltage $V_{S/D}$ is sufficient to cause electron tunneling from the well region 105 toward the charge storage region 124. However, there is no need to utilize band-to-band hot hole erase (BTBHHE), thereby reducing or eliminating hot-hole introduced damage.

Figure 5A:
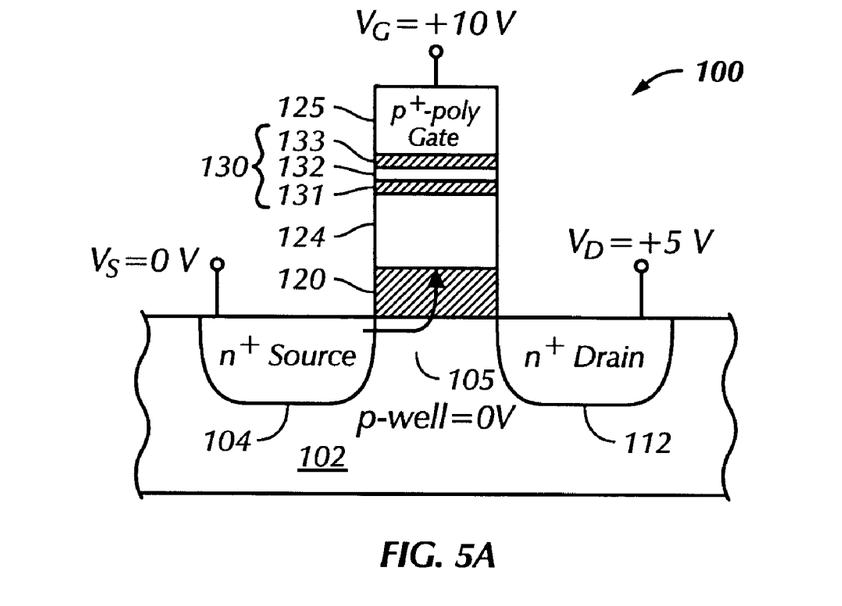
FIG. 5A is a partial sectional side elevational view of the n-channel NVM cell of FIG. 1A being programmed by channel hot electron (CHE) injection.
Figure 5B:
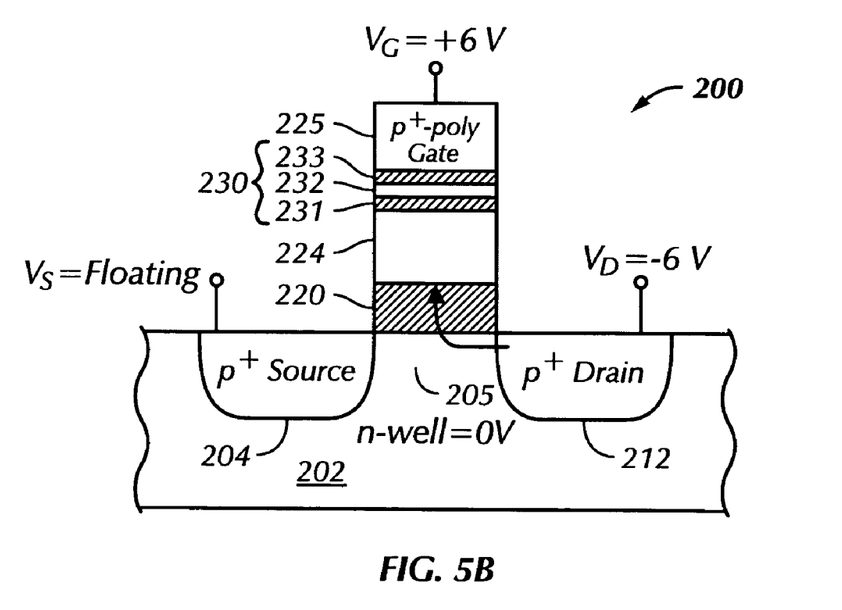
FIG. 5B is a partial sectional side elevational view of the p-channel NVM cell of FIG. 1B being programmed by band-to-band tunneling induced hot electron (BBHE)

The NVM cell 100 is programmed by an electron injection method. For n-channel devices 100 (FIG. 1A) channel hot electron (CHE) injection, source side injection (SSI), channel initiated secondary electron (CHISEL) injection and the like, can be employed. For p-channel devices 200 (FIG. 1B), band-to-band tunneling hot electron (BBHE) injection, channel hot-hole initiated hot electron injection or simply negative Fowler-Nordheim (-FN) gate injected electrons or the like can be employed. FIG. 5A shows n-channel programming by CHE injection and FIG. 5B shows p-channel programming by BBHE injection. Preferably, the NVM cell 100 can be programmed with 2-bits per cell 100 with a first bit in the charge storage layer 124 closer to the source region 104 and a second bit in the charge storage layer 124 closer to the drain region 112, as is known in the art.

The NVM cell 100 is read by conventional reading methods such as applying a gate read voltage to the control gate 125 and a source/drain read voltage to one of the source region 104 and the drain region 112 and grounding the other of the source region 104 and the drain region 112. The well region 105 is also grounded during a read operation. For example, the gate read voltage and the source/drain read voltage may each be between about 1-2 VDC.

Figure 6A:
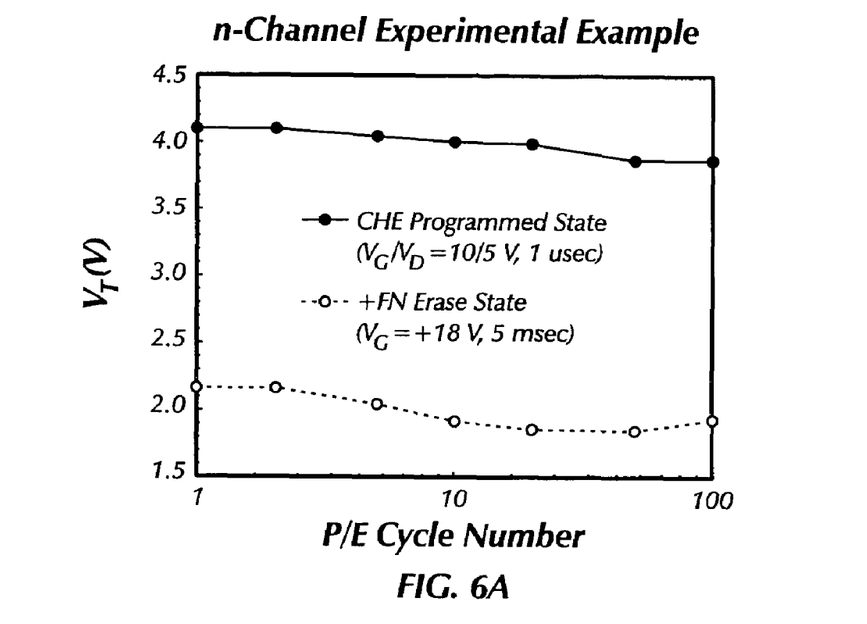
FIG. 6A is a graph demonstrating experimental data regarding programming and erasing the n-channel NVM cell of FIG. 1A.
Figure 6B:
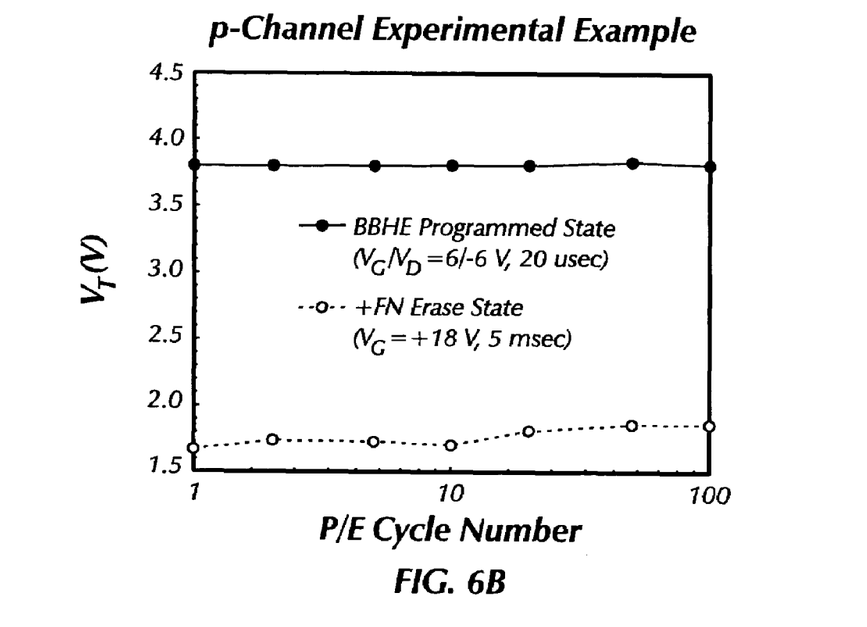
FIG. 6B is a graph demonstrating experimental data regarding programming and erasing the p-channel NVM cell of FIG. 1B.

FIG. 6A is a graph demonstrating experimental data regarding programming and erasing the n-channel NVM cell of FIG. 1A. FIG. 6B is a graph demonstrating experimental data regarding programming and erasing the p-channel NVM cell of FIG. 1B.

Figure 3A:
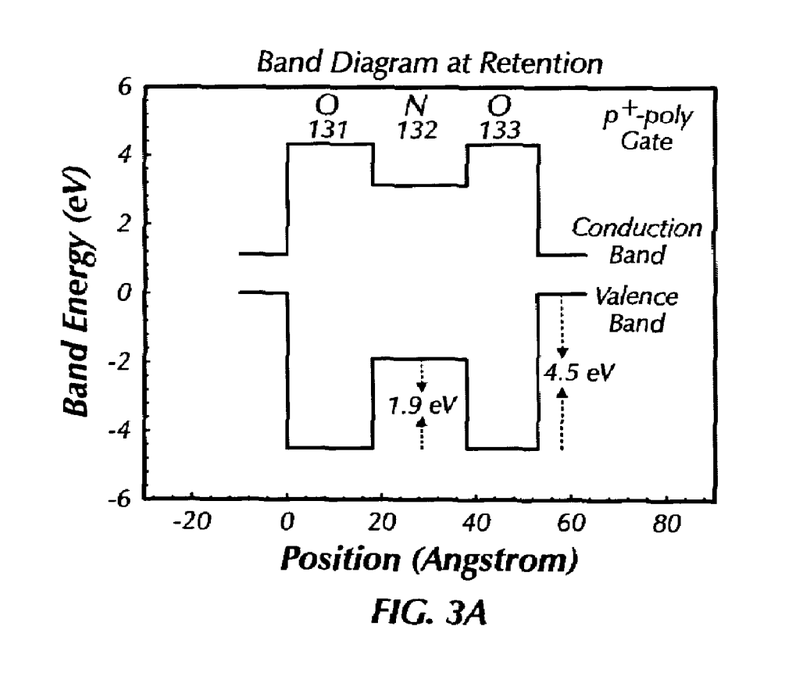
FIG. 3A is a band energy diagram of an oxide-nitride-oxide (ONO) dielectric layer in a charge retention state.
Figure 3B:
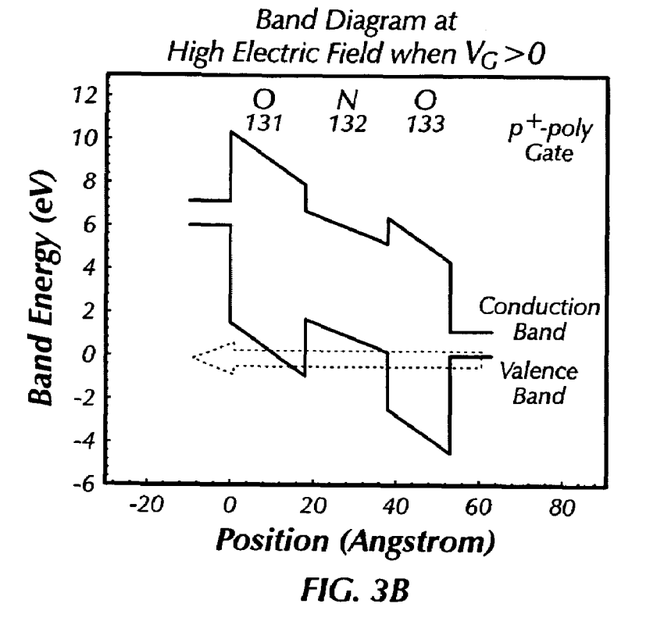
FIG. 3B a band energy diagram of an oxide-nitride-oxide (ONO) dielectric layer when voltage applied to a control gate is non-zero.

FIG. 3A is a band energy diagram of the ONO dielectric layer 130 in a charge retention state ($V_G \approx 0$). Band offset of the ONO dielectric layer 130 does not occur when there is a low electric field, so tunneling is suppressed. FIG. 3B is a band energy diagram of the ONO dielectric layer 130 when voltage $V_G$ applied to the control gate 125 is non-zero ($V_G>0$). When there is a relatively high electric field, band offset of the ONO dielectric layer 130 occurs thereby providing hole tunneling from the control gate 125 to toward the charge storage layer 124.

Figure 1B:
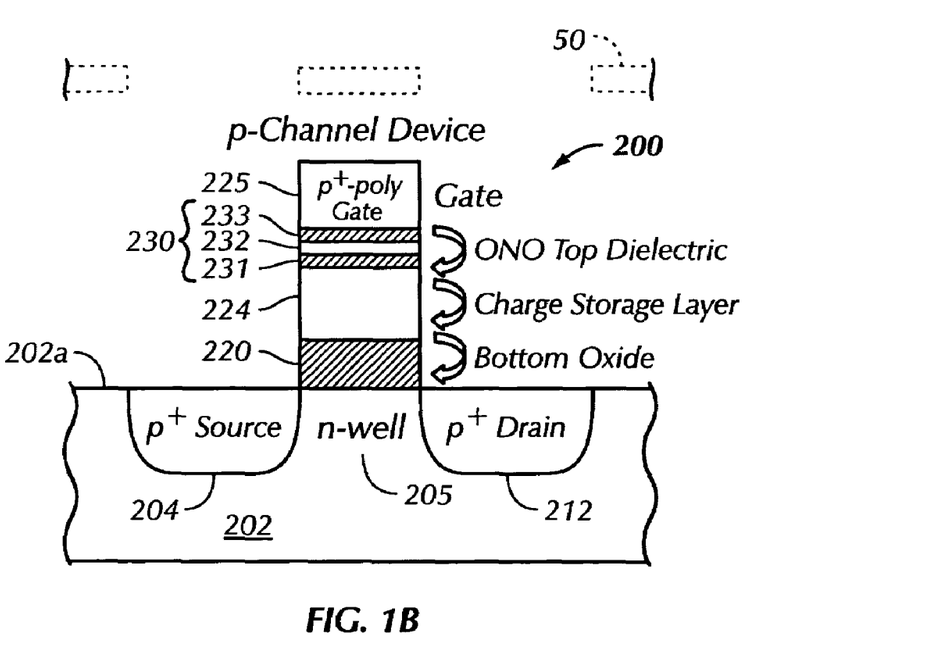
FIG. 1B is a partial sectional side elevational view of a p-channel non-volatile memory (NVM) cell having an oxide-nitride-oxide (ONO) dielectric layer in accordance with a second preferred embodiment of the present invention.

FIG. 1B depicts a non-volatile memory (NVM) cell 200 in accordance with a second preferred embodiment of the present invention. The NVM cell 200 includes a silicon substrate 202 having a main surface 202a, a source region 204 in a portion of the silicon substrate 202 proximate the main surface 202a, and a drain region 212 in a portion of the silicon substrate 202 proximate the main surface 202a. The drain region 212 is spaced apart from the source region 204. A well region 205 is disposed in a portion of the silicon substrate 202 proximate the main surface 202a between the source region 204 and the drain region 212. The NVM cell 200 includes a bottom oxide layer 220 formed on the main surface 202a of the silicon substrate 202. The bottom oxide layer 220 is disposed on a portion of the main surface 202a proximate the well region 205. A charge storage layer 224 is disposed above the bottom oxide layer 220 relative to the main surface 202a of the silicon substrate 202. A dielectric tunneling layer 230 is disposed above the charge storage layer 224 relative to the main surface 202a of the silicon substrate 202. The dielectric tunneling layer 230 includes, in order relative to the main surface 202a of the silicon substrate 202 and outward, a first dielectric oxide layer 231, a dielectric nitride layer 232 and a second dielectric oxide layer 233, thus the dielectric layer 230 is an oxide-nitride-oxide (ONO) layer 230. A control gate 225 is disposed above the dielectric tunneling layer 230 relative to the main surface 202a of the silicon substrate 202.

As shown, the NVM cell 200 is a P-channel device (FIG. 1B) because the source region 204 and drain region 212 are both p-type regions and the well region 105 is an n-type region. Thus, an n-type substrate 202 can be doped or implanted with a p-type material in the areas where the desired source and drain regions 204, 212 are to be located. Alternately, trenches may be formed in the n-type substrate 202 for desired source and drain regions 204, 212, and the trenches can be refilled with a p-type material such as with a heavily doped p-type polysilicon ($p^+$) and the like.

Similar, to the first preferred embodiment, the bottom oxide layer 220 is preferably between about 30-90 Å in thickness. The bottom oxide layer 220 is formed of an oxide material such as Aluminum Oxide ($Al_2O_3$). The charge storage layer 224 is preferably between about 50-150 Å in thickness. The charge storage layer 225 is preferably formed of a nitride such as Silicon Nitride ($Si_3N_4$), Silicon Oxynitride ($SiO_xN_x$) and the like. The charge storage layer 225 may be alternate materials instead of nitride that can function as a trapping insulating material such as Aluminum Oxide ($Al_2O_3$), Hafnium Oxide ($HfO_2$) and the like. Each of the first and second dielectric oxide layers 231 and 233 and the dielectric nitride layer 232 is preferably between about 10-30 Å in thickness. For example, the first dielectric oxide layer 231 can be about 18 Å in thickness, the dielectric nitride layer 232 can be about 20 Å in thickness and the second dielectric oxide layer 233 can be about 15 Å in thickness. The control gate 225 may be formed of undoped polysilicon, doped polysilicon or a metal. For example, the control gate 225 may be lightly or heavily n-doped polysilicon, lightly or heavily p-doped polysilicon, platinum (Pt), Tantalum Nitride (TaN) and the like.

Thus, the NVM cell 200 is preferably a silicon-oxide-nitride-oxide-nitride-oxide-silicon (SONONOS) device wherein the gate 225 is formed of polysilicon, the top dielectric layer 230 is formed of oxide-nitride-oxide (ONO), the charge storage layer 224 is formed of nitride and the blocking layer 220 is formed of oxide which are all on top of the silicon substrate 202.

The gate materials of 125 and 225 are preferably a $p^+$-polysilicon. In this way, a large density of holes can be provided by applying a positive gate voltage $V_G$.

The present invention also includes methods of forming the NVM cells 100, 200 in accordance with the preferred embodiments. The method of forming the memory cell 100, 200 includes providing a silicon substrate 102, 202 having a main surface 102a, 202a, forming a source region 104, 204 in a portion of the silicon substrate 102, 202 proximate the main surface 102a, 202a and forming a drain region 112, 212 in a portion of the silicon substrate 102, 202 proximate the main surface 102a, 202a. The drain region 112, 212 is spaced apart from the source region 104. A well region 105, 205 is defined in a portion of the silicon substrate 102, 202 proximate the main surface 102a, 202a between the source region 104, 204 and the drain region 112, 212. A bottom oxide layer 120, 220 is deposited on the main surface 102a, 202a of the substrate 102, 202 through the mask 50. The bottom oxide layer 120, 220 is disposed on a portion of the main surface 102a, 202a proximate the well region 105, 205. A charge storage layer 124, 224 is formed above the bottom oxide layer 120, 220 relative to the main surface 102a, 202a of the silicon substrate 102, 202. A first dielectric oxide layer 131, 231 is deposited above the charge storage layer 124, 224 relative to the main surface 120a, 202a of the silicon substrate 102, 202. A dielectric nitride layer 132, 232 is deposited above the first dielectric oxide layer 131, 231 relative to the main surface 102a, 202a of the silicon substrate 102, 202. A second dielectric oxide layer 133, 233 is deposited above the dielectric nitride layer 132, 232 relative to the main surface 102a, 202a of the silicon substrate 102, 202. A control gate 125, 225 is formed above the second dielectric oxide layer 133, 233 relative to the main surface 102a, 202a of the silicon substrate 102, 202. A mask 50 (shown in phantom in FIGS. 1A-1B) is placed proximate the main surface of the silicon substrate 102, 202. The mask 50 leaves exposed at least portion of the main surface 102a, 202a proximate the well region 105, 205. Appropriate portions of layers 120, 124, 131, 132, 133 and 220, 224, 231, 232, 233 and gates 125, 225 may be removed by etching or by a different removal technique.

As mentioned above, the bottom oxide layer 120, 220 is preferably between about 30-90 Å in thickness, the charge storage layer 124, 224 is preferably between about 50-150 Å in thickness, and each of the first and second dielectric oxide layers 131, 231 and 133, 233 and the dielectric nitride layer 132, 232 is preferably between about 10-30 Å in thickness.

The NVM cell 100 may be an N-channel device (FIG. 1A) by making, likely by doping and/or implanting, the source region 104 and drain region 112 both n-type regions and by leaving the well region 105 a p-type region.

Alternatively, the NVM cell 200 may be a P-channel device (FIG. 1B) by making, likely by doping and/or implanting, the source region 204 and drain region 212 both p-type regions and by leaving the well region an n-type region. Alternately, trenches may be formed in the n-type substrate 202 for desired source and drain regions 204, 212, and the trenches can then be refilled with a p-type material such as with a heavily doped p-type polysilicon and the like.

The various layers 120, 124, 131, 132, 133 and 220, 224, 231, 232, 233 and gates 125, 225 may be formed in any of a variety of ways known in the art. For example, the 120, 124, 131, 132, 133 and 220, 224, 231, 232, 233 and gates 125, 225 maybe grown or deposited. Deposition may be by chemical vapor deposition (CVD), physical vapor deposition (PVD), evaporation, sputtering and the like. Patterns may be formed on the surface of the semiconductor substrate by photolithography or photomasking ("masking") techniques. The various 120, 124, 131, 132, 133 and 220, 224, 231, 232, 233 and gates 125, 225 may be etched back by mechanical etching or by chemical etching and/or chemical mechanical polishing (CMP) and the like. Additionally, known methods of doping, heat treating, diffusing, etching, layering, trenching, polishing and the like, may be utilized in the fabrication process of the a NVM cell 100, 200 without departing from the present invention.

The NVM cells 100, 200 may be applied to various memory types including NOR and NAND memories. The NVM cells 100, 200 can be used in a virtual ground array architecture.

The top dielectric layer 130, 230 may include additional layers of oxide and/or nitride and/or may include additional layers of other materials.

From the foregoing, it can be seen that the present invention is directed to a non-volatile memory semiconductor device having an ONO top dielectric layer and a method for manufacturing a non-volatile memory semiconductor device having an ONO top dielectric layer. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A non-volatile memory cell comprising:
a silicon substrate having a main surface;
a source region in a portion of the silicon substrate proximate the main surface;
a drain region in a portion of the silicon substrate proximate the main surface, the drain region being spaced apart from the source region;
a well region disposed in a portion of the silicon substrate proximate the main surface between the source region and the drain region;
a bottom oxide layer formed on the main surface of the substrate, the bottom oxide layer disposed on a portion of the main surface proximate the well region;
a dielectric charge storage layer disposed above the bottom oxide layer relative to the main surface of the silicon substrate;
a dielectric tunneling layer disposed above the charge storage layer relative to the main surface of the silicon substrate, the dielectric tunneling layer including, in order relative to the main surface of the silicon substrate and outward, a first dielectric oxide layer, an insulating dielectric layer having a hole barrier height less than that of the first dielectric oxide layer and a second dielectric oxide layer; and
a control gate disposed above the dielectric tunneling layer relative to the main surface of the silicon substrate; and
a voltage applied in an operating mode establishing an electric field across the data storage structure which induces hole tunneling current through the dielectric tunneling layer to reduce negative charge in the charge storage layer.

2. The non-volatile memory cell according to claim 1, wherein the control gate comprises n-doped polysilicon.

3. The non-volatile memory cell according to claim 1, wherein the control gate comprises at least one of p-doped polysilicon, platinum (Pt) and Tantalum Nitride (TaN).

4. The non-volatile memory cell according to claim 1, wherein each of the first and second dielectric oxide layers and the insulating dielectric layer are between about 10-30 Angstroms (Å) in thickness.

5. The non-volatile memory cell according to claim 4, wherein the first dielectric oxide layer is about 18 Å in thickness, the insulating dielectric layer is silicon nitride about 20 Å in thickness and the second dielectric oxide layer is about 15 Å in thickness.

6. The non-volatile memory cell according to claim 1, wherein the bottom oxide layer is between about 30-90 Angstroms (Å) in thickness.

7. The non-volatile memory cell according to claim 1, wherein the bottom oxide layer is formed of Aluminum Oxide ($Al_2O_3$).

8. The non-volatile memory cell according to claim 1, wherein the dielectric charge storage layer is about 50-150 Angstroms (Å) in thickness.

9. The non-volatile memory cell according to claim 1, wherein the charge storage layer is formed of at least one of Silicon Nitride ($Si_3N_4$), Silicon Oxynitride (SiON), Aluminum Oxide ($Al_2O_3$) and Hafnium Oxide ($HfO_2$).

10. The non-volatile memory cell according to claim 1, wherein the source and drain regions are n-type regions and the well region is a p-type region.

11. The non-volatile memory cell according to claim 1, wherein the source and drain regions are p-type regions and the well region is an n-type region.

12. The non-volatile memory cell according to claim 1, wherein the charge storage layer stores two separately readable bits including a first bit proximate the source region and a second bit proximate the drain region.

13. The non-volatile memory cell according to claim 1, wherein said hole tunneling barrier height of the insulating dielectric layer is less than 3 eV.

14. A non-volatile memory device, comprising:
a gate;
a substrate including a channel, a source terminal and a drain terminal; and
a charge storage structure between the gate and the substrate, the charge storage structure including
a dielectric charge storage layer having first and second sides;
a blocking dielectric layer, comprising aluminum oxide, adjacent to the first side of the charge storage layer;
a dielectric tunneling layer adjacent the second side of the charge storage layer, the dielectric tunneling layer including a first dielectric oxide layer, an insulating dielectric layer having a hole barrier height less that of the first dielectric layer and a second dielectric oxide layer; and
a voltage applied in an operating mode establishing an electric field across the data storage structure which induces hole tunneling current through the dielectric tunneling layer to reduce negative charge in the dielectric charge storage layer.

15. The non-volatile memory device according to claim 14, wherein said first dielectric oxide layer comprises silicon dioxide, said insulating dielectric layer comprises silicon nitride, and said second dielectric oxide layer comprises silicon dioxide.

16. The non-volatile memory device according to claim 14, wherein said hole barrier height of the insulating dielectric layer is less than 3 eV.

* * * * *